(12) United States Patent
Okamoto et al.

(10) Patent No.: US 8,759,663 B2
(45) Date of Patent: Jun. 24, 2014

(54) METHOD OF MANUFACTURING SOLAR BATTERY

(75) Inventors: Shingo Okamoto, Toyonaka (JP); Masao Turi, Takaoka (JP)

(73) Assignee: Sanyo Electric Co., Ltd., Moriguchi-Shi (JP)

( * ) Notice: Subject to any disclaimer, the term of this patent is extended or adjusted under 35 U.S.C. 154(b) by 1601 days.

(21) Appl. No.: 10/594,389

(22) PCT Filed: Mar. 30, 2005

(86) PCT No.: PCT/JP2005/006057
§ 371 (c)(1),
(2), (4) Date: May 24, 2007

(87) PCT Pub. No.: WO2005/096396
PCT Pub. Date: Oct. 13, 2005

(65) Prior Publication Data
US 2007/0283995 A1 Dec. 13, 2007

(30) Foreign Application Priority Data
Mar. 31, 2004 (JP) ................................ 2004-104786

(51) Int. Cl.
*H01L 31/18* (2006.01)
(52) U.S. Cl.
USPC .............. 136/244; 136/251; 136/256; 438/80
(58) Field of Classification Search
USPC .............................. 136/244, 251, 256; 438/80
See application file for complete search history.

(56) References Cited

U.S. PATENT DOCUMENTS

| | | | | |
|---|---|---|---|---|
| 3,833,362 A | * | 9/1974 | Postupack | 420/555 |
| 3,833,425 A | * | 9/1974 | Leinkram et al. | 136/246 |
| 4,149,665 A | * | 4/1979 | Frosch et al. | 228/5.1 |
| 4,534,502 A | | 8/1985 | Piurek | 228/102 |
| 4,542,258 A | * | 9/1985 | Francis et al. | 136/256 |
| 5,074,920 A | * | 12/1991 | Gonsiorawski et al. | 136/244 |
| 5,133,810 A | * | 7/1992 | Morizane et al. | 136/251 |
| 5,178,685 A | * | 1/1993 | Borenstein et al. | 136/244 |
| 5,391,235 A | * | 2/1995 | Inoue | 136/244 |

(Continued)

FOREIGN PATENT DOCUMENTS

| | | |
|---|---|---|
| EP | 1 160880 A2 | 5/2001 |
| EP | 1 160880 A3 | 7/2005 |

(Continued)

OTHER PUBLICATIONS

Supplementary European Search Report dated Dec. 18, 2007.

(Continued)

*Primary Examiner* — Golam Mowla
(74) *Attorney, Agent, or Firm* — Kratz, Quintos & Hanson, LLP

(57) ABSTRACT

An object is to provide a method of manufacturing a solar battery, in which residues such as a flux and organic matters remaining on cell surfaces are preferably removed and in which an energy conversion efficiency is largely enhanced, and the method comprises: a flux applying step of applying a flux to the surfaces of cells; a tab disposing step of disposing the tabs over the adjacent cells to which the flux has been applied; a tab string step of connecting the tabs to the cells by soldering; and a cell heating step of heating the cells connected to the tabs.

18 Claims, 9 Drawing Sheets

(56) References Cited

U.S. PATENT DOCUMENTS

| | | | | |
|---|---|---|---|---|
| 5,428,249 | A * | 6/1995 | Sawayama et al. | 257/746 |
| 5,466,302 | A * | 11/1995 | Carey et al. | 136/251 |
| 5,667,596 | A | 9/1997 | Tsuzuki et al. | 428/256 |
| 6,121,542 | A * | 9/2000 | Shiotsuka et al. | 136/256 |
| 6,378,200 | B1 * | 4/2002 | Lim et al. | 29/832 |
| 6,493,145 | B1 * | 12/2002 | Aoki et al. | 359/597 |
| 6,710,239 | B2 * | 3/2004 | Tanaka | 136/244 |
| 6,841,728 | B2 * | 1/2005 | Jones et al. | 136/244 |
| 7,754,962 | B2 * | 7/2010 | Okamoto et al. | 136/244 |
| 2002/0148499 | A1 * | 10/2002 | Tanaka | 136/256 |
| 2003/0000568 | A1 * | 1/2003 | Gonsiorawski | 136/251 |
| 2003/0127124 | A1 | 7/2003 | Jones et al. | 136/244 |
| 2003/0129810 | A1 * | 7/2003 | Barth et al. | 438/462 |
| 2004/0016456 | A1 * | 1/2004 | Murozono et al. | 136/250 |
| 2005/0136232 | A1 * | 6/2005 | Forrest et al. | 428/212 |
| 2006/0283496 | A1 * | 12/2006 | Okamoto et al. | 136/244 |
| 2007/0062574 | A1 * | 3/2007 | Shiomi et al. | 136/256 |
| 2007/0283995 | A1 * | 12/2007 | Okamoto et al. | 136/244 |
| 2009/0014060 | A1 * | 1/2009 | Nakatani et al. | 136/251 |
| 2009/0050190 | A1 * | 2/2009 | Nishida et al. | 136/244 |

FOREIGN PATENT DOCUMENTS

| | | |
|---|---|---|
| JP | 5-245622 | 9/1993 |
| JP | 05-245622 | 9/1993 |
| JP | 6-334203 | 12/1994 |
| JP | 06-334203 | 12/1994 |
| JP | 08-222849 | 8/1996 |
| JP | 8-222849 | 8/1996 |
| JP | 2000-22188 | 1/2000 |
| JP | 2002-022188 | 1/2000 |
| JP | 2002-217434 | 8/2002 |
| JP | 2003-168811 | 6/2003 |
| JP | 2005-072389 | 3/2005 |
| JP | 2005-72389 | 3/2005 |
| WO | WO 96/21054 | 11/1996 |
| WO | WO 02/103809 A1 | 12/2002 |

OTHER PUBLICATIONS

International Search Report issued for PCT/JP2005/06057 dated May 10, 2005.

* cited by examiner

METHOD OF MANUFACTURING SOLAR BATTERY

BACKGROUND OF THE INVENTION

The present invention relates to a method of manufacturing a solar battery, more particularly to a method of manufacturing a solar battery constituted by electrically connecting a plurality of cells to one another by connection members referred to as tabs or tab lead wires.

In recent years, from a global environment protection problem such as global warming, expectations for clean energy have grown, and a solar battery which directly converts solar energy (sunlight) into electric energy has received attention as a clean energy source. For example, the solar battery includes a plurality of photoelectric conversion cells, and tabs each constituted of a copper foil is soldered to these adjacent cells to electrically connect them to one another, thereby constituting a string. This tab is used as a lead wire which connects a plurality of cells in series or as an output terminal (see Japanese Patent Application Laid-Open No. 2003-168811).

In a general method of manufacturing such a solar battery string 100, as shown in FIG. 9, first a plurality of cells 12 are prepared (first step). Moreover, after applying a liquefied flux warmed at a predetermined temperature to portions (shown dotted lines) of the surfaces of the plurality of cells 12 where tabs 14 are to be soldered (second step), the tabs 14 are disposed on the top of the cell 12 and the undersurface of the adjacent cell 12 (third step). Next, the tabs 14 are pressed onto the cells 12 from above so as to prevent the arranged tabs 14 from being raised, and the tabs 14 are soldered (fourth step).

When such tabs 14 are soldered onto the surfaces of the cells 12, organic matters and the like mixed with the flux are attached to the cells 12. If these organic matters and the flux remain on the surfaces of the cells 12, an energy conversion efficiency of the solar battery deteriorates. Therefore, heretofore, after soldering the tabs 14 onto the cells 12, a cleaning step of cleaning the cells 12 has been performed to clean and remove residues such as the flux and the organic matters from the surfaces of the cells 12 with warm water, chemicals, steam or the like.

Moreover, the string 100 constituted of the plurality of cells 12 cleaned in this manner is disposed between a protective sheet or light transmitting glass on the backside and light transmitting glass on the surface, and sealed with a filler (EVA or the like), whereby the solar battery is manufactured. There is also a case where residues such as the flux and the organic matters on the surfaces of the cells 12 are disposed between pieces of glass or between the glass and the sheet as they are without being cleaned in a sealed manner.

However, the operation of cleaning and removing residues such as the flux and the organic matters on the cell surfaces with the warm water, chemical, steam or the like after soldering the tabs causes an increase of steps of manufacturing the solar battery. Therefore, there is a problem that a cost increase of the solar battery is caused.

Moreover, in a case where after soldering the tabs, residues such as the flux and the organic matters on the cell surfaces are disposed between the pieces of glass or between the glass and the sheet without being cleaned in the sealed manner, even when residues such as the flux and the organic matters remain on the cell surfaces, they cannot be removed. Especially in a case where residues such as the organic matters and the flux on the cell surfaces are gasified by heating in a step of forming a module or the like, and remain as a large number of bubbles, sunlight striking on the cell surfaces is irregularly reflected, or the sunlight is intercepted. Therefore, there is a problem that a drop of the energy conversion efficiency of the solar battery is incurred.

SUMMARY OF THE INVENTION

The present invention has been developed to solve such a conventional technical problem, and an object thereof is to provide a method of manufacturing a solar battery, in which influences of residues such as a flux and organic matters remaining on cell surfaces are effectively removed, and an energy conversion efficiency can largely be enhanced.

That is, a first aspect of the invention is a method of electrically connecting a plurality of cells to one another by tabs to manufacture a solar battery, comprising: a flux applying step of applying a flux to the surfaces of the cells; a tab disposing step of disposing the tabs over the adjacent cells to which the flux has been applied; a tab string step of connecting the tabs to the cells by soldering; and a cell heating step of heating the cells connected to the tabs. Such a flux satisfactorily perform the soldering, and contains substances such as organic matters. For example, a water-soluble flux is usable in such a flux.

In the method of manufacturing the solar battery in a second aspect of the invention, a heating temperature of the cell heating step is not less than a boiling temperature of the flux.

In the method of manufacturing the solar battery in a third aspect of the invention, a heating temperature of the cell heating step is not less than an activating temperature of the flux.

In the method of manufacturing the solar battery in a fourth aspect of the invention, in the cell heating step, the heating temperature is +140° C. or more and +160° C. or less, and a heating time is one minute or more and five minutes or less.

In the method of manufacturing the solar battery in a fifth aspect of the invention, in the cell heating step, the heating temperature is +150° C., and the heating time is three minutes.

In the method of manufacturing the solar battery in a sixth aspect of the invention, in the cell heating step, the heating temperature is more than +160° C., and a heating time is less than one minute.

In the method of manufacturing the solar battery in a seventh aspect of the invention, in the cell heating step, the heating temperature is +200° C. or more, and the heating time is less than 20 seconds.

In the method of manufacturing the solar battery in an eighth aspect of the invention, in the cell heating step, the heating temperature is +250° C. or more, and the heating time is less than ten seconds.

In the method of manufacturing the solar battery in a ninth aspect of the invention, in the cell heating step of each invention described above, the whole cells are heated.

In the method of manufacturing the solar battery in a tenth aspect of the invention, the cell heating step of each invention described above includes: heat release means for preventing a solder which connects the tabs to the cells from being molten.

In the method of manufacturing the solar battery in an eleventh aspect of the invention, the heat release means is a conveyance belt which conveys the cells and which comes into contact with at least a tab portion during the conveyance.

In the method of manufacturing the solar battery in a twelfth aspect of the invention, in the tab string step, the conveyance belt does not come into contact with the tab portion, and in the cell heating step, the conveyance belt comes into contact with the tab portion.

In the method of manufacturing the solar battery in a thirteenth aspect of the invention, in the tab string step of each invention described above, hot air is blown against the tabs to perform the soldering, and in the cell heating step, the cells are irradiated with an infrared ray and heated. It is preferable that means for irradiating the cells with the infrared ray is a lamp heater.

In the first aspect of the invention, in a case where the plurality of cells are electrically connected to one another by the tabs to manufacture the solar battery, the method of manufacturing the solar battery comprises: the flux applying step of applying the flux to the surfaces of the cells; the tab disposing step of disposing the tabs over the adjacent cells to which the flux has been applied; the tab string step of connecting the tabs to the cells by soldering; and the cell heating step of heating the cells connected to the tabs. Therefore, in this cell heating step, in a case where the cells are heated at the temperature which is not less than the boiling temperature of the flux as in, for example, the second aspect of the invention, the flux applied during (before) the soldering of the tabs to the cells can be evaporated. In a case where the cells are heated at the temperature which is not less than the flux activating temperature in the cell heating step as in, for example, the third aspect of the invention, even if the flux remains, the influence of the flux can be neutralized.

In consequence, when (before) the tabs are soldered to the cells, residues such as the flux and the organic matters attached to the cells can effectively be removed or neutralized. Therefore, without performing a cleaning step of removing residues such as the flux applied to the cell surfaces and the organic matters as in a conventional art, it is possible to prevent a disadvantage that the inside of each cell turns white owing to the residues. Therefore, while reducing manufacturing costs of the solar battery, it is possible to realize enhancement of quality of the solar battery and improvement of the energy conversion efficiency.

Especially, when the cells are heated at +140° C. or more and +160° C. or less for one minute or more and five minutes or less as in the fourth aspect of the invention, preferably when the cells are heated at +150° C. for three minutes as in the fifth aspect of the invention, it is possible to prevent a disadvantage that the solder which connects the tabs to the cells is molten again.

Moreover, in a case where the heating temperature in the cell heating step is set to be more than +160° C. as in the sixth aspect of the invention, even if the heating time is less than one minute, the flux can effectively be evaporated. Especially, in a case where the heating temperature in the cell heating step is set to be more than +200° C. as in the seventh aspect of the invention, even if the heating time is less than 20 seconds, the influence of the flux can be removed. Furthermore, in a case where the heating temperature in the cell heating step is set to be more than +250° C. as in the eighth aspect of the invention, even if the heating time is less than ten seconds, the influence of the flux can be removed. When the cells are heated at the high temperature in this manner, a treatment time in the cell heating step can largely be reduced, and a production efficiency can be improved.

Especially, when the heating at such a high temperature is performed for a short time, there are effects that characteristics of boundary faces of layers of the cells are improved by an annealing effect and that characteristics of the solar battery are also improved. The effects become more remarkable by the heating at a high temperature such as 200° C. or more or 250° C. or more for the short time. Moreover, when the whole cells are heated in the cell heating step as in the ninth aspect of the invention, the characteristics can more uniformly be improved.

In this case, when in the cell heating step, there is disposed the heat release means for preventing the solder which connects the tabs to the cells from being molten again as in the tenth aspect of the invention, it is possible to securely prevent a disadvantage that the solder which connects the tabs to the cells is molten again by the heating at the high temperature in the cell heating step. Especially, in a case where as this heat release means, the conveyance belt also serves, which conveys the cells and which comes into contact with at least the tab portion during the conveyance as in the eleventh aspect of the invention, without disposing any special heat release or cooling device, the solder on the tabs can be prevented from being molten again, and equipment costs can be reduced.

Especially, in this case, as in the twelfth aspect of the invention, the conveyance belt does not come into contact with the tab portion in the tab string step, and the conveyance belt comes into contact with the tab portion in the cell heating step. Accordingly, in the tab string step, the heat can be prevented from escaping from the conveyance belt so that the tab portion is set at the highest temperature, and in the cell heating step, conversely, the temperature of the tab portion can be lowered.

Moreover, as in the thirteenth aspect of the invention, the soldering in the tab string step is performed by blowing the hot air against the tabs. Moreover, in the cell heating step, the cells are irradiated with the infrared ray and heated. In this case, in the tab string step, the tab portion can be heated in a concentrated manner, and in the cell heating step, the whole cells can broadly be heated.

In consequence, in the tab string step, while a cell portion other than the tab portion can be prevented from being damaged, or minimized, the tabs can securely be soldered. Moreover, in the cell heating step, the whole cells are uniformly heated, and the influence of the flux can effectively be removed. Alternatively or additionally, cell characteristics can be improved.

DETAILED DESCRIPTION OF THE PREFERRED EMBODIMENTS

The present invention provides a method of removing residues such as a flux applied to cell surfaces and organic matters without cleaning them in order to enhance an energy conversion efficiency of a solar battery. An object to remove influences of residues such as the flux and the organic matters and enhance the energy conversion efficiency of the solar battery has been realized by a simple method of simply heating cells to which tabs have been soldered.

Embodiment 1

Figure 1:
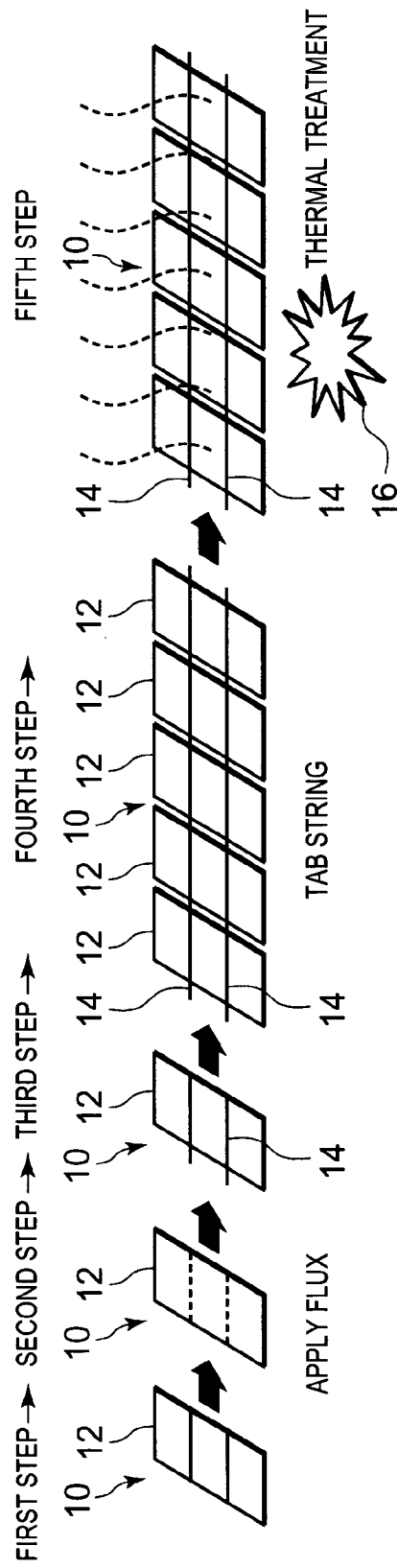
FIG. 1 is a manufacturing step diagram of a solar battery showing one embodiment of the present invention.

Next, an embodiment of the present invention will be described in detail with reference to the drawings. FIG. 1 shows a manufacturing step diagram of a solar battery showing one embodiment of the present invention. It is to be noted that this embodiment shows a method of manufacturing a general solar battery. Since a technology to manufacture this solar battery is heretofore well known, detailed description thereof is omitted, and main points will be described.

First, in the present invention, each of cells 12 of the solar battery is formed into an about 10 by 10 cm square. Moreover, the cells 12 are arranged in one row in a longitudinal direction in a pallet (not shown), and detachably attached, and subsequent step operations are performed. In a method of manufacturing the solar battery, as shown in FIG. 1, the plurality of cells 12 using an n-type crystalline silicon substrate 10 constituted of a crystalline semiconductor such as polycrystal silicon is prepared, and the substrate is mounted on the pallet (first step). In this case, the substrate 10 in which the plurality of cells 12 are formed is shown in a fourth step described later, and in the other steps, the single cell 12 is shown.

Next, a liquefied flux warmed at a predetermined temperature is applied to portions (shown dotted lines) of the surfaces of the plurality of cells 12 where tabs (connection members) 14 are to be soldered (second step), and two tabs 14 (collector electrodes) are arranged in parallel with each other over the adjacent cells 12 (third step). Each of the tabs 14 is constituted of a copper foil or the like having a width of about 2 mm and having conductivity, and in the vertical direction of the tab 14, a large number of branched electrodes (not shown) each having a width of about 50 μm are extended and arranged.

Next, the tabs 14 are pressed onto the cells 12 with two rows of pressing tools (not shown) each having a thickness approximately equal to the width of the tab 14 and having a heat resistance so as to prevent the arranged tabs 14 from being raised, and the cell 12 are soldered and electrically connected to the tabs 14 in series (fourth step). It is to be noted that although not shown, the pressing tools are constituted so as to press the tabs 14 during the soldering and move apart from the cells 12 after end of the soldering. It is to be noted that if the tabs 14 can be soldered to the cells 12 without being pressed, the pressing tools do not have to be necessarily used.

When the flux is applied to the surface of the cell 12 or when the tabs 14 are soldered, a large number of bubbles are generated in the flux. The flux for use in soldering the tabs 14 is mixed with the organic matters or the like. It is to be noted that since the cells 12 are soldered and connected to the tabs 14 in series, the top of one cell 12 is connected to the undersurface (not shown) of the adjacent cell 12 by the tabs 14.

Next, after the cells 12 are soldered with the tabs 14 in series, the cells 12 are heated from below by a coil or rod-like electric heater 16 at +140° C. to +160° C., preferably +150° C. for a heating time of one to five minutes, preferably three minutes. Accordingly, the flux applied to the cells 12 is evaporated (fifth step). In this case, the cells are heated at +150° C. at which the n-type crystalline silicon substrate 10 constituted of a crystalline semiconductor such as polycrystal silicon is not damaged or broken without generating any trouble in the energy conversion efficiency and for a short heating time of three minutes.

Thus, unlike a conventional art, even in a case where residues such as the flux applied to the surfaces of the cells 12 and the organic matters are not cleaned or removed with warm water, chemicals, steam or the like, when the cells 12 are simply heated with the electric heater 16, it is possible to remove a cause of bubbles, because the evaporation of the flux enables to evaporate and remove residues such as the organic matters mixed with the flux. Therefore, in the subsequent step, the bubbles can be prevented from being generated in a module.

Moreover, after soldering the tabs 14 to the cells 12, finally glass having a light transmitting property and a weather resistance is laminated on the surfaces of the cells 12, and the solar battery is completed. In this case, there are laminated, in this order: a transparent surface-side cover made of reinforced extra-clear glass or the like; a film as a filler; the plurality of soldered cells 12 electrically connected in series; a film as a filler; and a backside cover constituted of a resin film made of polyethylene terephthalate (PET) or the like having the weather resistance. In the laminated state, they are heated and pressurized to thereby form a plate-like constituting member. Thereafter, there are attached: a metal frame member which supports the constituting member and which is made of aluminum or the like; a terminal box and the like, and a solar battery module is completed. It is to be noted that to evaporate the flux applied to the cells 12, the surfaces of the cells 12 are irradiated with an infrared ray by an infrared lamp including a reflective mirror capable of irradiating the surfaces of the cell 12 with the infrared ray from above the cells 12 in a concentrated manner, and the flux may be evaporated by heat generated in this manner. Alternatively, warm air at a predetermined temperature may be blown against the surfaces of the cells 12 to evaporate the flux. In a case where the warm air is blown against the surfaces of the cells 12, since convection of air on the surfaces of the cells 12 enlarges, there is produced a great effect of evaporating the flux, and the flux can be evaporated for a short time as compared with the electric heater, the infrared lamp or the like.

Thus, the method includes: a step of forming the plurality of cells 12 on the surface of the substrate 10; a step of applying the flux to the surfaces of the plurality of cells 12; a step of arranging the tabs 14 over the adjacent cells 12 to which the flux has been applied; a step of connecting the tabs 14 to the cells 12 by soldering; and a step of heating the cells 12 connected to the tabs 14 with the electric heater 16. When the cells 12 are heated at, for example, +150° C. for a heating time of three minutes, unlike the conventional art, the flux can be evaporated and removed without cleaning the flux applied to the surfaces of the cells 12.

In consequence, when the tabs 14 are soldered to the cells 12, influences of residues such as the organic matters attached to the cells 12 can be removed. Therefore, unlike the conventional art, any cleaning step is not required for removing residues such as the flux applied to the surfaces of the cells 12 and the organic matters, and costs of the solar battery can be reduced.

Especially, it is possible to prevent a disadvantage that the surfaces of the cells 12 turn white, when the flux is evaporated. Therefore, unlike the conventional art, quality of the solar battery can largely be enhanced without performing any flux cleaning step. Moreover, the energy conversion efficiency can be enhanced.

Moreover, since the cells 12 are heated with the electric heater 16 to evaporate the flux applied to the surfaces of the cells 12, the bubbles of the flux on the surfaces of the cells 12 can largely be reduced. This can prevent irregular reflection of sunlight striking on the surfaces of the cells 12. Furthermore, the flux on the surfaces of the cells 12 can be evaporated to thereby substantially eliminate an amount of the flux applied to the surfaces of the cells 12. In consequence, since the flux remaining on the surfaces of the cells 12 can be remarkably thinned, the sunlight into the cells 12 is hardly intercepted, and the energy conversion efficiency of the solar battery can largely be enhanced.

Embodiment 2

Figure 2:
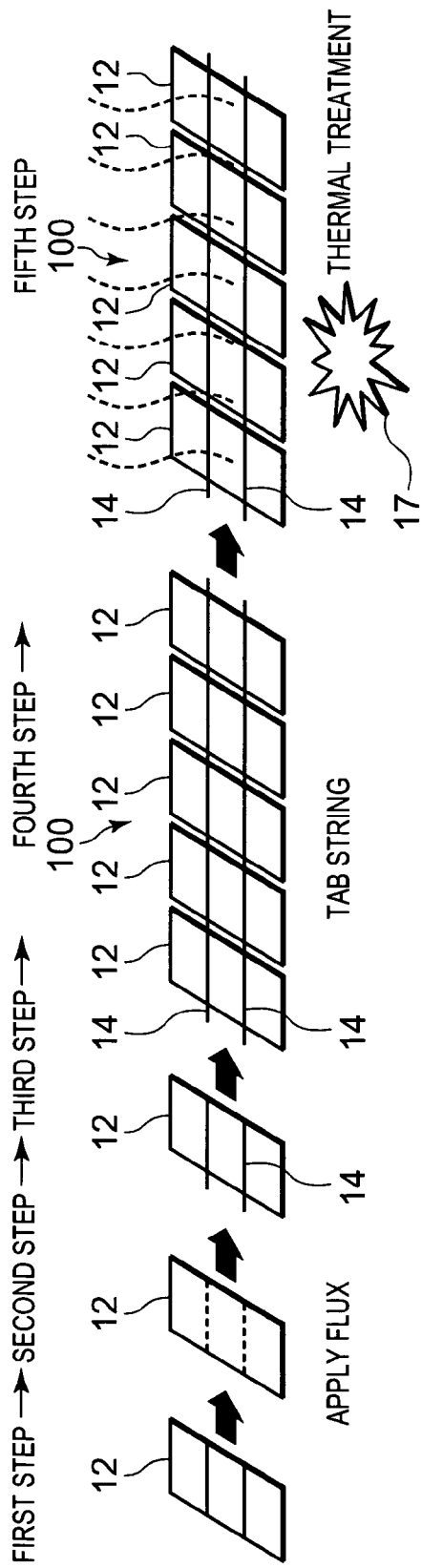
FIG. 2 is a manufacturing step diagram of a solar battery in another embodiment of the present invention.
Figure 9:
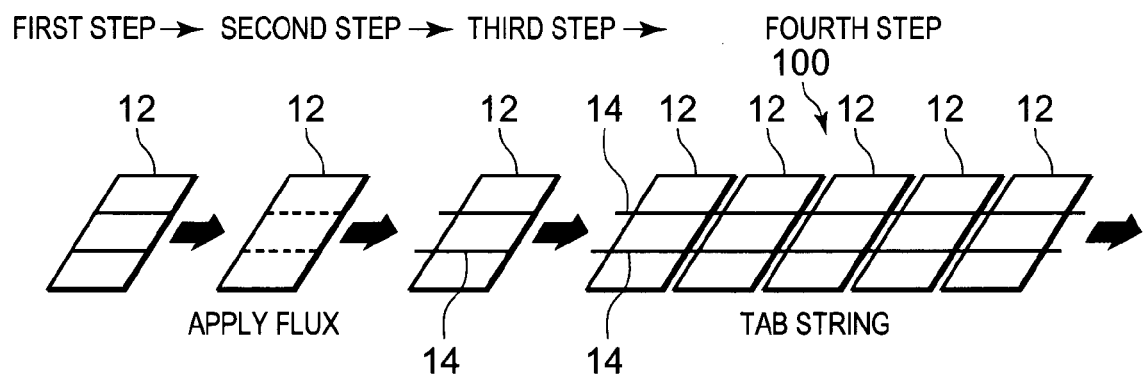
FIG. 9 is a conventional manufacturing step diagram of a solar battery.

Next, another embodiment of the present invention will be described in detail with reference to the drawings. FIG. 2 shows a manufacturing step diagram of a solar battery string 100 showing the present embodiment. It is to be noted that in FIG. 2, components denoted with the same reference numerals as those of FIG. 9 produce the same or similar functions. In the present embodiment, instead of a crystal type such as single crystal silicon or polycrystal silicon, an amorphous type such as amorphous silicon or a single crystal (crystalline substrate) type is used in the substrate. There are used single crystal or amorphous hybrid general cells 12 (solar battery cells) constituted by forming amorphous layers of silicon on opposite surfaces of the substrate. A method of manufacturing a solar battery constituted in this manner will be described. Since a technology to manufacture these cells 12 are heretofore well known, detailed description thereof is omitted, and main points will be described.

In the present invention, each of the cells 12 is formed into an about 10 by 10 cm square. On each of opposite surfaces of the cell, two rows of collector electrodes (width of about 2 mm) are arranged in parallel, and in the vertical direction of the collector electrodes, a large number of branched electrodes (width of about 50 μm) are extended and arranged. Such cells 12 are arranged in one row in a longitudinal direction in a pallet (not shown), and detachably attached, and subsequent step operations are performed. In the method of manufacturing the solar battery, as shown in FIG. 2, the cells 12 are produced and mounted on a pallet (first step).

Next, to collector electrode portions of the surfaces of the cells 12, that is, portions (shown dot lines) in which tabs 14, 14 are to be soldered as connection members, there is applied a liquefied flux warmed at a predetermined temperature (water-based substance having a boiling point of about +100° C., the substance is vaporized at the boiling point or less, and activated at about +200° C. or more) (second step as a flux applying step). It is to be noted that each of the tabs 14 is constituted of a copper foil having a width of about 2 mm and having conductivity, and a solder is applied to the surface of the tab.

Figure 3:
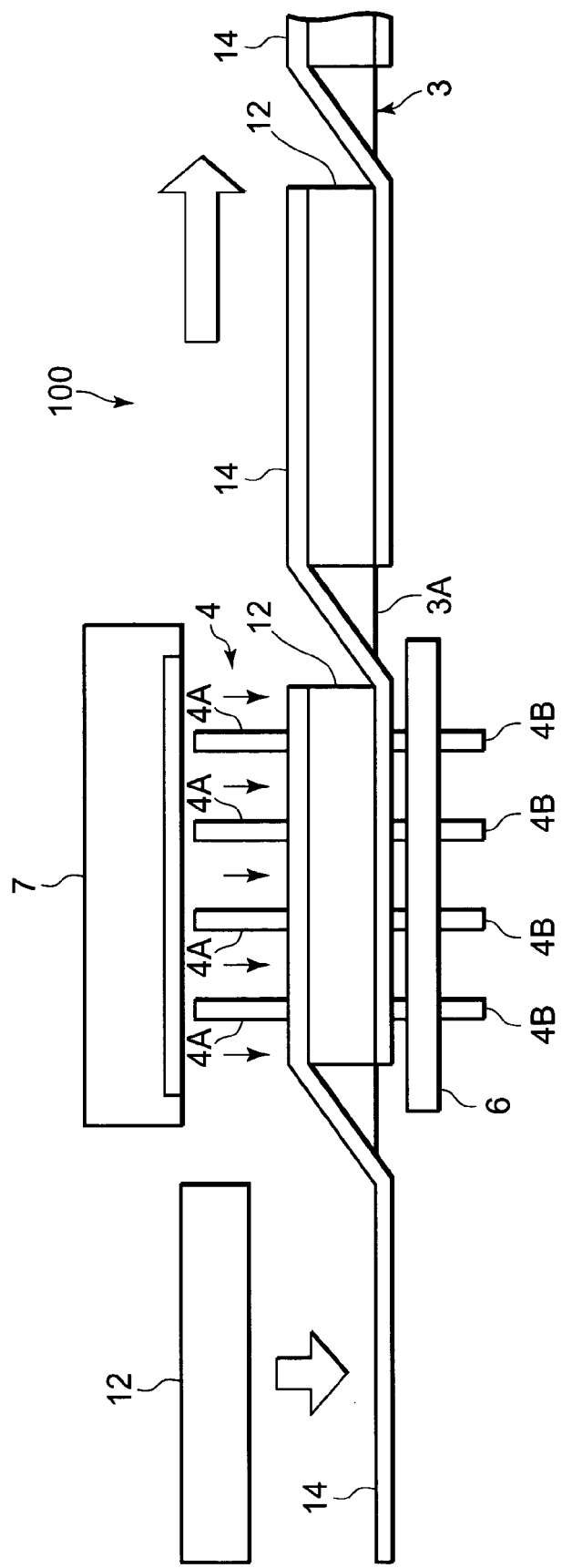
FIG. 3 is an explanatory view of a tab string step of FIG. 2.
Figure 4:
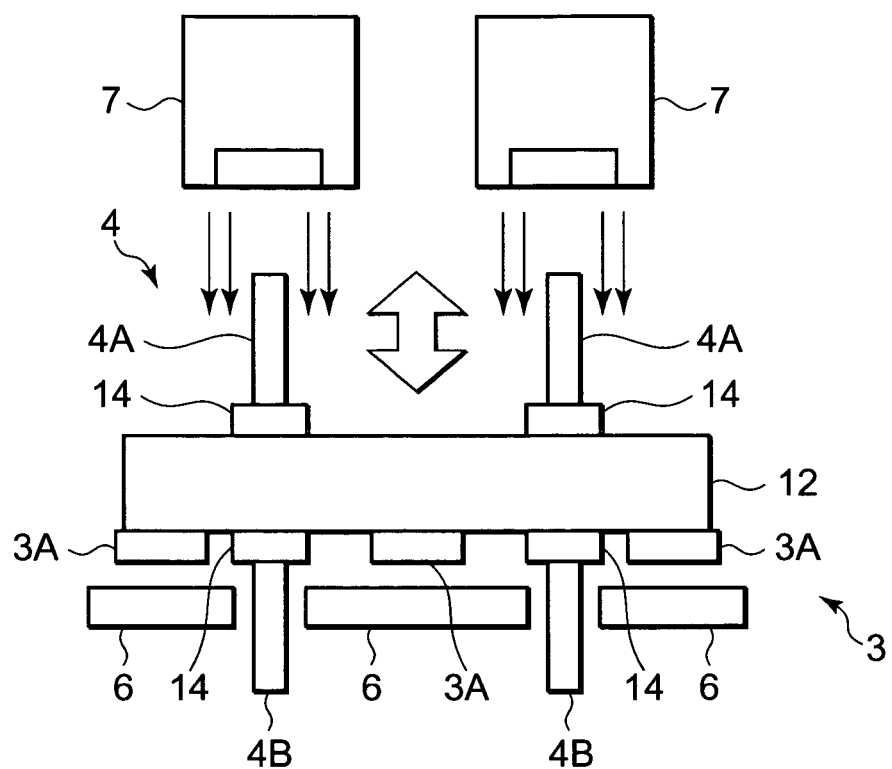
FIG. 4 is similarly an explanatory view of a tab string step of FIG. 2.
Figure 7:
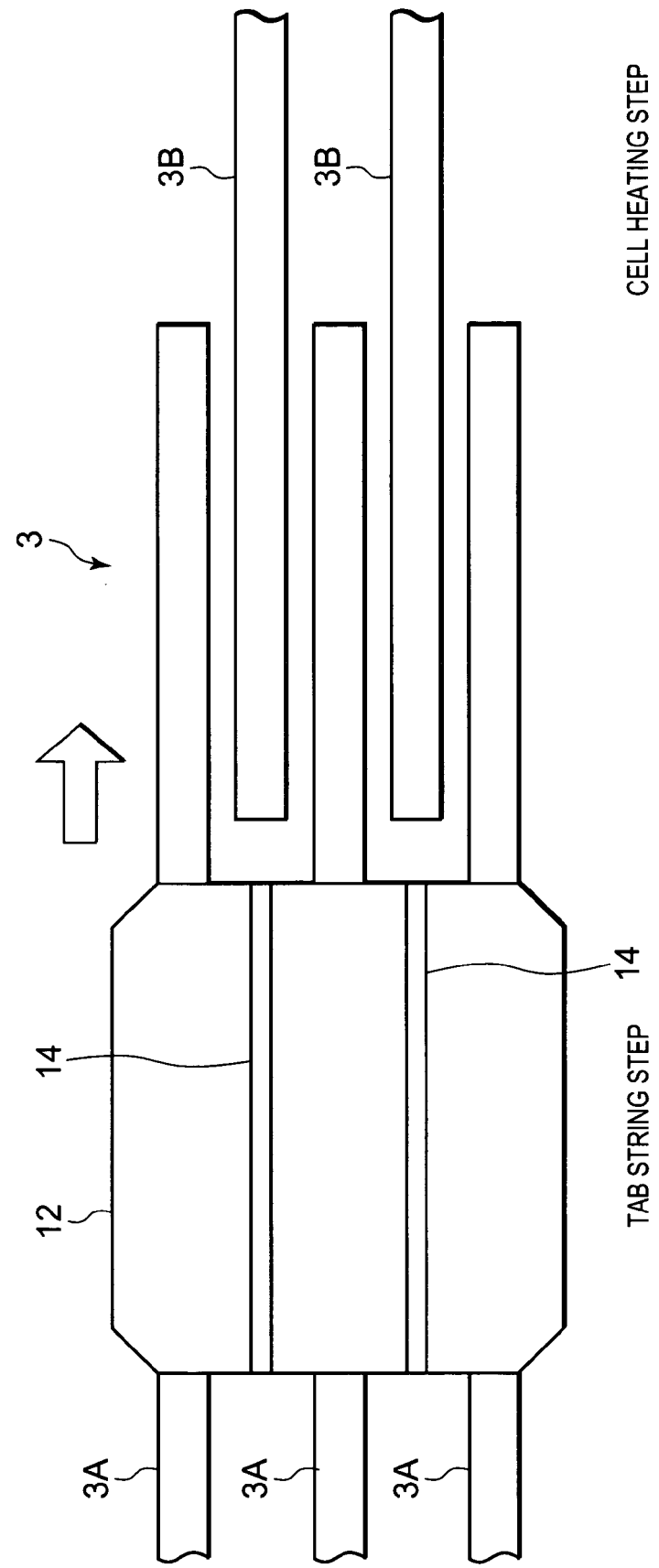
FIG. 7 is a plan view of a conveyance belt in the tab string step and the cell heating step of FIG. 2.

Next, the step shifts to a third step as a tab disposing step. This shift to the third step will be described with reference to FIGS. 3 and 4. In FIGS. 3 and 4, reference numeral 3 denotes a conveyance belt (conveyance means) constituted of an endless belt. The belt conveys the cells 12 toward the right as facing FIG. 3 by an intermittent operation in which the belt stops for a predetermined time, and thereafter moves along a predetermined distance. As shown in FIG. 7, this conveyance belt 3 is constituted of: conveyance belts 3A positioned in a tab string step (soldering position); and conveyance belts 3B positioned in a cell heating step. Three conveyance belts 3A are arranged in positions which avoid the tabs 14, 14 on the undersurface of the cell 12. Conversely, two conveyance belts 3B are arranged in positions which correspond to the tabs 14, 14 on the undersurface of the cell 12 and where the belts come into contact with the tabs.

Reference numeral 4 denotes a pressing device disposed above and under a predetermined soldering position. The device is constituted of two rows of pins 4A . . . , 4B . . . which are vertical moved by driving means (not shown). It is to be noted that the pins 4A . . . , 4B . . . are constituted of a material which is not soldered. The upper and lower pins are vertically arranged above and under two tabs 14, 14 arranged as shown in FIGS. 3, 4 so as to face each other. Moreover, under the conveyance belt 3 positioned below this pressing device 4, hot plates (underside heating means) 6 each constituted of an electric heater are disposed, and constantly energized during an operation.

Furthermore, warm air heaters (warm air type heating means) 7, 7 are vertically arranged in positions corresponding to those of the pins of this pressing device 4 above the tabs 14, 14. Each of the warm air heaters 7, 7 is constituted of, for example, an electric heater energized to heat and a blower, and air (hot air) heated by the electric heater is blown against tabs 14, 14 portions by the blower in a concentrated manner.

The cell 12 to which the flux has been applied in the second step is next mounted on the conveyance belts 3A. Next, two tabs 14 corresponding to the collector electrodes are arranged on the left and the right in a travel direction of the conveyance belts 3A (third step as a tab disposing step). In actual, two tabs 14 are arranged which correspond to the collector electrodes on the undersurface of the first cell 12 constituting the string 100, and a front-part (front part in the travel direction of the conveyance belt 3) half of each tab is drawn out in the travel direction. Moreover, the conveyance belt 3 is moved along a predetermined distance, and the cell 12 is moved to the predetermined soldering position and stopped for a predetermined time. The tabs 14 are then arranged which correspond to the collector electrodes on the top of the cell 12.

At this time, a rear-part (rear part in the travel direction of the conveyance belt 3) half of each of the tabs 14, 14 (tabs arranged on the top of the first cell 12) is drawn out, and on the half, the next cell 12 is mounted. In this case, the top of the cell 12 is on a plus side, and the undersurface of the cell is on a minus side.

Two tabs 14, 14 are arranged to abut on the top and the undersurface of the cell 12 in this manner. In this state, for a time when the cell is stopped, the pins 4A . . . , 4B . . . of the pressing device 4 lower to press the tabs 14, 14 onto the top and the undersurface of the cell 12 so as to prevent the tabs from being raised. If the tabs 14 can be soldered to the cell 12 without being pressed, the pressing device 4 does not have to be necessarily used.

In a state in which the tabs 14 are pressed onto the cell 12 in this manner, the electric heaters and the blowers of the warm air heaters 7, 7 are energized to blow hot air at a high temperature against the tabs 14, 14 in a concentrated manner, and the solder on the tabs 14, 14 is heated at a melting temperature (+186° C. to +187° C.) or more. It is to be noted that the solder on the tabs 14, 14 on the undersurface of the cell is also heated at a melting temperature by heat transfer due to a temperature rise accompanying the blowing of the hot air from the top of the cell and the heating from the hot plates 6 arranged under the cell (fourth step as a tab string step).

Here, since the hot air from the warm air heaters 7, 7 is blown against the tabs 14, 14 in the concentrated manner, there is not any problem that another portion of the cell 12 is excessively heated and the temperature abnormally rises to damage the cell 12. In this case, since the conveyance belts 3A do not come into contact with the tabs 14 on the undersurface of the cell, the melting of the solder can be accelerated at the high temperature in the vicinity of each tab 14 without allowing the temperature of this tab portion to escape.

While the tabs 14 are pressed onto the cell 12 by the pressing device 4 in this manner, the hot air is blown from the warm air heaters 7, 7 for a predetermined time. Thereafter, the electric heater and the blower of each warm air heater 7 are stopped. It is to be noted that even after the blowing of this hot air, the tabs 14 remain to be pressed onto the cell 12 by the pins 4A . . . , 4B . . . of the pressing device 4 until the solder is cooled to securely connect the tabs 14 to the cell 12.

In this duration, the cell 12 is mounted on the rear parts of the tabs 14, 14 on the top of the cell 12 as described above. Thereafter, the pins 4A . . . , 4B . . . move apart from above the cell 12. Next, the conveyance belts 3A are moved along the predetermined distance, and this newly mounted cell 12 is moved to the soldering position to mount the tabs 14 on the top of the cell again. Thus, the cells 12 are soldered in series by the tabs 14 to thereby manufacture the string 100.

Figure 5:
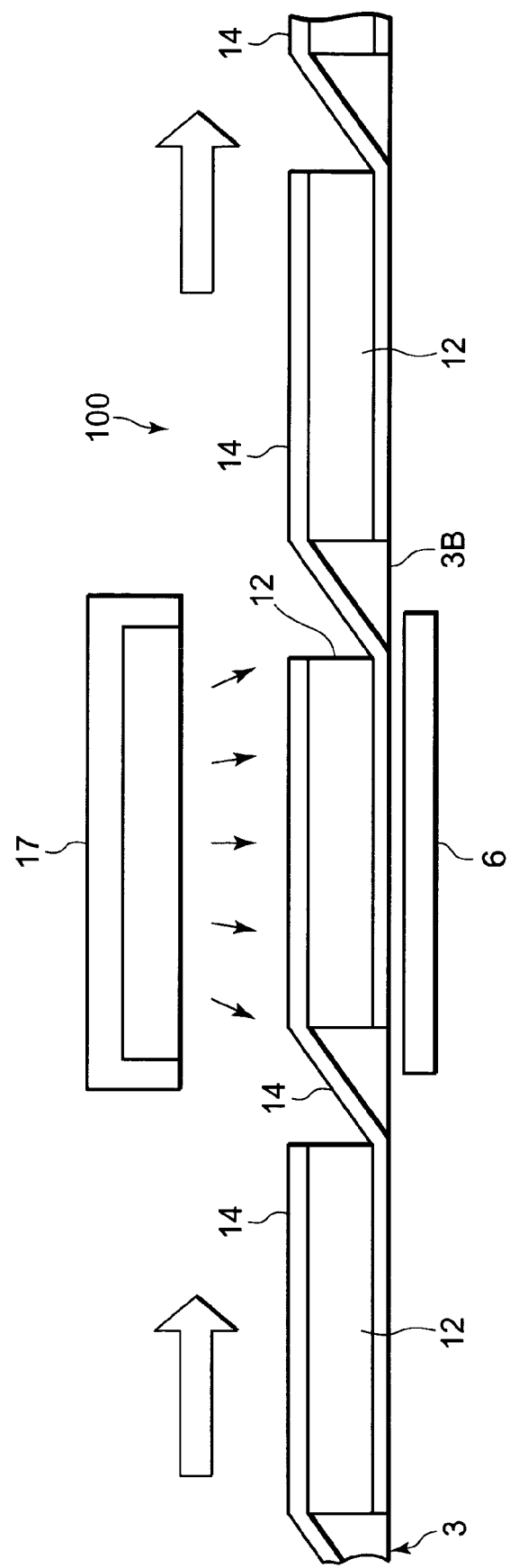
FIG. 5 is an explanatory view of a cell heating step of FIG. 2.
Figure 6:
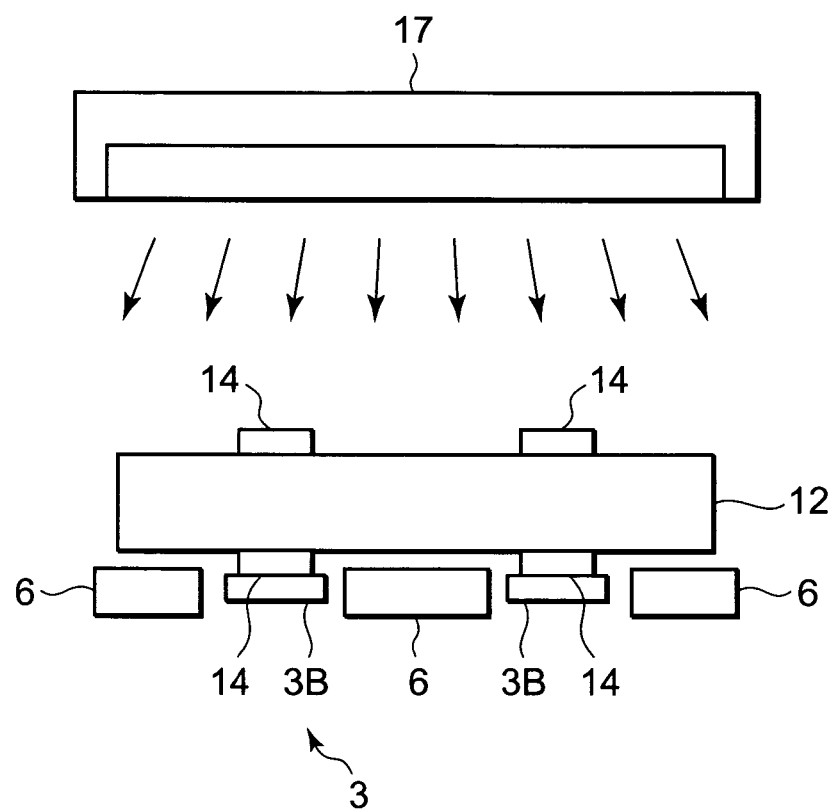
FIG. 6 is similarly an explanatory view of the cell heating step of FIG. 2.

Here, when the flux is applied to the surface of the cell 12 or the tabs 14 are soldered, the flux is gasified, and a large number of bubbles are generated. The flux for use in soldering the tabs 14 is mixed with organic matters. Subsequently to the tab string step (fourth step), in the present invention, a fifth step is performed as a cell heating step. FIGS. 5 and 6 show this fifth step (cell heating step). It is to be noted that in the figures, components denoted with the same reference numerals as those of FIGS. 3 and 4 are the same components. FIG. 7 shows a behavior of the conveyance belt 3 from the fourth step to the fifth step. After the tab string step, the cell 12 is transferred from the conveyance belts 3A to the conveyance belts 3B for the cell heating step.

That is, as shown, above a predetermined cell heating position disposed ahead of the soldering position in the travel direction of the conveyance belt 3, a lamp heater 17 is disposed. This lamp heater 17 is constituted of an infrared lamp. In this cell heating position, the above-described hot plates 6 are arranged under the cell 12, but a constitution is preferable in which the hot plates 6 are omitted from portions corresponding to the tabs 14 in order to prevent the portions from being heated.

Moreover, the cell 12 to which the tabs 14 are soldered in the fourth step as described above is next moved to the cell heating position by the conveyance belts 3A, 3B. In this cell heating position, the cell 12 is irradiated from above with an infrared ray of the lamp heater 17, and heated from below by the hot plates 6. Since the infrared ray from this lamp heater 17 diffuses, the whole top of the cell 12 is irradiated with the infrared ray, and the cell 12 is therefore entirely heated.

At this time, a heating temperature is set at +140° C. or more and +160° C. or less, and a heating time is set to one minute to five minutes. Preferably, the cell 12 is heated at +150° C. for three minutes. Accordingly, the flux applied to the cell 12 is evaporated. At such a heating temperature (150° C.) and for such a heating time (three minutes), the cell 12 is not deteriorated or broken by the heating, and any trouble is not generated in an energy conversion efficiency. At a temperature of +140° C. to +160° C., the solder of the tabs 14 is not molten again.

In consequence, unlike a conventional art, without cleaning and removing residues such as the flux applied to the surface of the cell 12 and the organic matters with warm water, chemicals, steam or the like, the cell 12 is heated by the lamp heater 17 on predetermined conditions, and accordingly influences of residues such as the organic matters mixed with the flux can be reduced by evaporation of the flux.

After such a fifth step, there are laminated, in this order: a transparent surface-side cover made of reinforced extra-clear glass or the like; a film as a filler; linear solar battery groups (strings) 100, 100 . . . constituted of the plurality of cells electrically connected in series; a film as a filler; and a backside cover constituted of a resin film made of polyethylene terephthalate (PET) or the like having a weather resistance. In the laminated state, they are heated and pressurized to thereby form a plate-like constituting member. Thereafter, there are attached: a metal frame member which supports the constituting member and which is made of aluminum or the like; a terminal box and the like, and a solar battery module is completed.

As described above, in the present invention, in a case where the plurality of cells 12 are electrically connected to one another by the tabs 14 to manufacture the solar battery, the method includes the flux applying step (second step) of applying the flux to the surface of each cell 12; the tab disposing step (third step) of arranging the tabs 14 over the adjacent cells 12 to which the flux has been applied; the tab string step (fourth step) of connecting the tabs 14 to the cells 12 by soldering; and the cell heating step (fifth step) of heating the cells 12 connected to the tabs 14. Therefore, in this cell heating step, it is possible to evaporate the flux applied when (before) the tabs 14 are soldered to the cells 12.

In consequence, it is possible to effectively remove residues such as the flux and the organic matters attached to the cells 12 when (before) the tabs 14 are soldered to the cells 12. Therefore, unlike the conventional art, without performing the cleaning step of removing residues such as the flux applied to the surfaces of the cells 12 and the organic matters, it is possible to avoid a disadvantage that the surface of each cell 12 turns white owing to the residues. Therefore, while reducing manufacturing costs of the solar battery, it is possible to realize enhancement of quality of the solar battery and improvement of the energy conversion efficiency.

Embodiment 3

Next, still another embodiment of the present invention will be described. In the above embodiment, in the fifth step (cell heating step), the cells 12 are heated at +140° C. to +160° C. for one minute to five minutes, preferably at +150° C. for three minutes. In this case, in the present embodiment, in the fifth step (cell heating step), the heating temperature is set to be higher than +160° C., and the heating time is set to be less than one minute and remarkably short.

Preferably, the heating temperature is set to +200° C. or more, and the heating time is reduced to be less than 20 seconds. Thus, when the heating temperature of each cell 12 in the fifth step is set to be higher than +160° C., a flux of the cell 12 can be activated and evaporated for a remarkably short heating time which is less than one minute. Especially, when the heating temperature is set at +200° C. or more, the flux can be activated and evaporated for a remarkably short heating time which is less than 20 seconds. Furthermore, when the heating temperature is set at +250° C. or more, the flux can be activated and evaporated for a remarkably short heating time which is less than ten seconds. In consequence, even if the flux remains, the influence of the flux can be neutralized.

That is, in this embodiment, when the cells are heated at such a high temperature, a treatment time (tact time) in the fifth step (cell heating step) can largely be reduced, and a production efficiency can be improved. It is to be noted that the heating temperature in the cell heating step is preferably +400° C. or less, from viewpoints of inhibiting of a solder material from being molten and characteristics of a solar battery.

Figure 8:
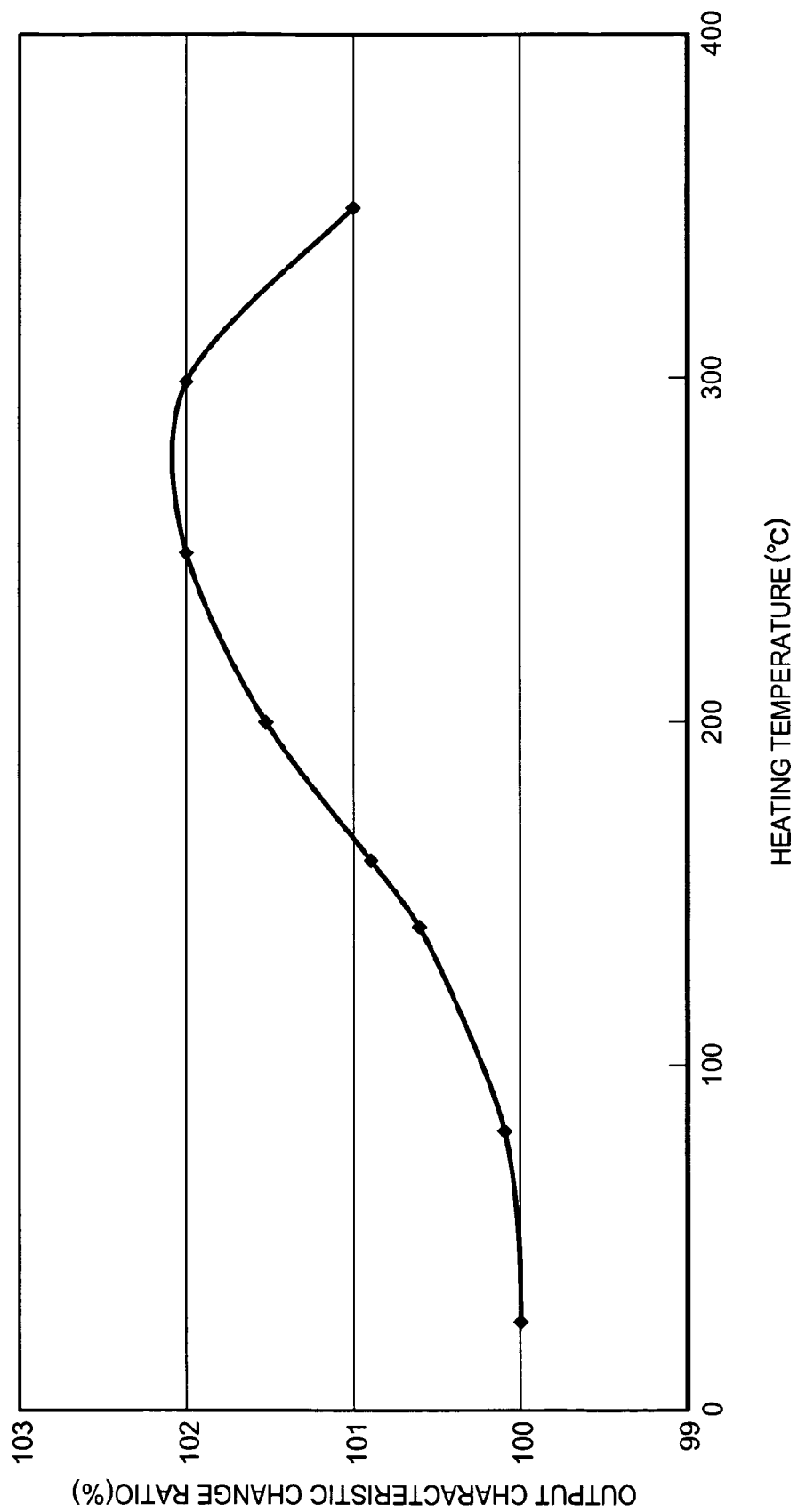
FIG. 8 is a diagram showing change ratios of output characteristics of cells by heating in the cell heating step.

Especially, when the heating at such a high temperature is performed for a short time, the interface properties of the cells 12 are improved by an annealing effect, and the characteristics of the solar battery can also be improved. FIG. 8 is a diagram showing a heating temperature in such a cell heating step and a change ratio of output characteristics of the cells 12. As apparent from this figure, the enhancement of the output characteristic of the cell 12 becomes remarkably, when the cells are heated at a high temperature such as 200° C. or more or 250° C. or more for the short time. Moreover, when the whole cell 12 is broadly heated with a lamp heater 17, the characteristics can more uniformly be improved.

In this case, since tabs 14 on the undersurface abut on conveyance belts 3B, heat from the lamp heater 17 is transmitted to the conveyance belts 3B to escape by heat conduction in each tab 14 portion, and the temperature drops in the vicinity of the tab 14. Therefore, since the heating is performed at the high temperature in the fifth step (cell heating step), it is possible to securely avoid a disadvantage that a solder which connects the tabs 14 to the cells 12 is molten again. Especially, in this case, the conveyance belts 3B also serve as heat release means of the tab 14 portion. Therefore, without disposing any special heat release or cooling device, it is possible to prevent the solder on the tabs 14 from being molten again, and equipment costs can be reduced. In the conveyance belts, a metal or non-metal material having a heat resistance is appropriately usable. It is to be noted that it is preferable to convey a portion to be heated with a material having a high thermal conductivity. In the same manner as in Embodiment 2, it is further preferable that conveyance belts which do not come into contact with the tabs such as the belts 3A of FIG. 7 are used during conveyance in a tab string step.

It is to be noted that in the above embodiments, especially in Embodiment 2, in the fifth step (cell heating step), the cell is heated from above by the lamp heater, but the present invention is not limited to this, and hot air may be blown from above against the whole cell by a warm air heater, or the cell may be heated from below by an electric heater. In a case where the whole cell is heated by the hot air, convection of air also occurs, and evaporation effect of the flux can be improved. However, when the lamp heater is used, there is an effect that a broader region can be heated.

Moreover, in the fourth step (tab string step), the warm air heater has been used, but the cell may be heated by a lamp heater which irradiates the cell with an infrared ray. However, when the warm air heater is used, there is an effect that the tabs can be heated in a more concentrated manner as compared with the lamp heater. In Embodiment 3, the conveyance belt has been used as heat release means, but the present invention is not limited to this embodiment, and heat release means may separately be disposed such as a cooling device or a heatsink which prevents the solder on the tabs from being molten again. However, when the conveyance belt also serves as the heat release means as in Embodiment 3, the equipment costs can be reduced as described above.

What is claimed is:

1. A method of manufacturing a solar battery by electrically connecting a plurality of cells to one another using connection members, comprising the following steps in the order named:
    a flux applying step of applying a flux to predetermined surfaces of the cells where the connection members are to be soldered;
    a disposing step of disposing the connection members over the adjacent cells to which the flux has been applied without performing a cleaning step of the surface of the cells;
    a string step of connecting the connection members to the cells by soldering without performing the cleaning step of the surface of the cells; and
    a cell heating step of heating the cells connected to the connection members.

2. The method of manufacturing the solar battery according to claim 1, wherein a heating temperature of the cell heating step is not less than a boiling temperature of the flux.

3. The method of manufacturing the solar battery according to claim 1, wherein a heating temperature of the cell heating step is not less than an activating temperature of the flux.

4. The method of manufacturing the solar battery according to claim 1, wherein in the cell heating step, a heating temperature is +140° C. or more and +160° C. or less, and a heating time is one minute or more and five minutes or less.

5. The method of manufacturing the solar battery according to claim 1, wherein in the cell heating step, a heating temperature is +150° C., and a heating time is three minutes.

6. The method of manufacturing the solar battery according to claim 1, wherein in the cell heating step, the heating temperature is more than +160° C., and a heating time is less than one minute.

7. The method of manufacturing the solar battery according to claim 1, wherein in the cell heating step, the heating temperature is +200° C. or more, and the heating time is less than 20 seconds.

8. The method of manufacturing the solar battery according to claim 1, wherein in the cell heating step, the heating temperature is +250° C. or more, and the heating time is less than ten seconds.

9. The method of manufacturing the solar battery according to claim 1, wherein in the cell heating step, the whole cells are heated.

10. The method of manufacturing the solar battery according to claim 1, wherein the cell heating step includes: heat release means for preventing a solder which connects the connection members to the cells from being molten.

11. The method of manufacturing the solar battery according to claim 10, wherein the heat release means is a conveyance belt which conveys the cells and which comes into contact with at least a connection members portion during the conveyance.

12. The method of manufacturing the solar battery according to claim 11, wherein, in the string step, the conveyance belt does not come into contact with the connection members portion, and in the cell heating step, the conveyance belt comes into contact with the connection members portion.

13. The method of manufacturing the solar battery according to claim 1, wherein in the string step, hot air is blown against the connection members to perform the soldering, and in the cell heating step, the cells are irradiated with an infrared ray to heat.

14. The method of manufacturing the solar battery according to claim 1, wherein in the cell heating step, the cells connected to the connection members are heated such that residue of flux is removed from a surface of the cells.

15. The method of manufacturing the solar battery according to claim 1, wherein in the cell heating step, the cells connected to the connection members are heated while the heat of the connection members is released to a conveyance belt which conveys the cells.

16. The method of manufacturing the solar battery according to claim 1, the flux is applied before the soldering.

17. A method of manufacturing a solar battery by electrically connecting a plurality of cells to one another using connection members, comprising the following steps in the order named:

a flux applying step of applying a flux to predetermined surfaces of the cells where the connection members are to be soldered;

a disposing step of disposing the connection members over the adjacent cells to which the flux has been applied without performing a cleaning step of the surface of the cells;

a string step of connecting the connection members to the cells by soldering without performing the cleaning step of the surface of the cells; and a cell heating step of heating the cells connected to the connection members, wherein the flux is applied before the soldering.

18. The method of manufacturing the solar battery according to claim 1, further comprising a step in which a glass having a light transmitting property is laminated on the surfaces of the cells after the cell heating step, wherein in the disposing step, the connection member is disposed on a top of one cell and an undersurface of an adjacent cell, and in the string step, the top of one cell is connected to the undersurface of the adjacent cell by the connection member.

\* \* \* \* \*